United States Patent
Scott et al.

(10) Patent No.: US 8,890,616 B2
(45) Date of Patent: Nov. 18, 2014

(54) POWER AMPLIFIER SYSTEM WITH A CURRENT BIAS SIGNAL PATH

(75) Inventors: Baker Scott, San Jose, CA (US); George Maxim, Milpitas, CA (US)

(73) Assignee: RF Micro Devices (Cayman Islands), Ltd., George Town (KY)

(*) Notice: Subject to any disclaimer, the term of this patent is extended or adjusted under 35 U.S.C. 154(b) by 23 days.

(21) Appl. No.: 13/310,577

(22) Filed: Dec. 2, 2011

(65) Prior Publication Data

US 2012/0139636 A1 Jun. 7, 2012

Related U.S. Application Data

(60) Provisional application No. 61/419,849, filed on Dec. 5, 2010.

(51) Int. Cl.
| | |
|---|---|
| *H03G 3/10* | (2006.01) |
| *H03F 3/24* | (2006.01) |
| *H03F 1/02* | (2006.01) |
| *H03G 3/30* | (2006.01) |
| *H03F 1/22* | (2006.01) |

(52) U.S. Cl.
CPC .......... *H03G 3/3042* (2013.01); *H03F 2200/18* (2013.01); *H03F 3/245* (2013.01); *H03F 2200/465* (2013.01); *H03F 2200/405* (2013.01); *H03F 1/0233* (2013.01); *H03F 1/0261* (2013.01); *H03F 1/223* (2013.01)
USPC .......................................... 330/285; 330/296

(58) Field of Classification Search
USPC .................... 330/285, 296, 150, 98
See application file for complete search history.

(56) References Cited

U.S. PATENT DOCUMENTS

| | | | |
|---|---|---|---|
| 3,988,691 A | 10/1976 | Shih | |
| 5,893,027 A | 4/1999 | Brueske | |
| 6,384,686 B2 * | 5/2002 | Ueno et al. | 330/285 |
| 6,583,664 B2 | 6/2003 | Mathe et al. | |
| 6,605,999 B2 * | 8/2003 | Matsushita et al. | 330/285 |
| 6,683,496 B2 * | 1/2004 | Poggi et al. | 330/132 |
| 7,061,313 B2 | 6/2006 | Kimball et al. | |
| 7,193,471 B2 * | 3/2007 | Tsutsui et al. | 330/285 |
| 7,333,778 B2 | 2/2008 | Pehlke et al. | |
| 7,482,798 B2 | 1/2009 | Han | |
| 7,839,218 B2 | 11/2010 | Shimamoto et al. | |
| 7,944,306 B2 * | 5/2011 | Prikhodko et al. | 330/285 |
| 2005/0093630 A1 | 5/2005 | Whittaker et al. | |
| 2005/0264352 A1 | 12/2005 | Ichitsubo et al. | |
| 2007/0049239 A1 | 3/2007 | Joung et al. | |
| 2008/0175306 A1 | 7/2008 | Matsuoka et al. | |
| 2009/0170454 A1 | 7/2009 | Hug et al. | |
| 2009/0270057 A1 | 10/2009 | Salle et al. | |
| 2010/0109778 A1 | 5/2010 | Ichitsubo et al. | |
| 2011/0025422 A1 | 2/2011 | Marra et al. | |

\* cited by examiner

*Primary Examiner* — Henry Choe
(74) *Attorney, Agent, or Firm* — Withrow & Terranova, P.L.L.C.

(57) ABSTRACT

Power amplifier (PA) systems are typically comprised of a signal path integrated circuit (IC) and a power control IC. Advanced CMOS technologies may allow smart integration of such ICs into a single IC and provide an opportunity to improve performance and cost. Specifically, the radio frequency (RF) signal path is designed to enable local biasing of the gain stages that comprise the RF signal path. By using current-mode biasing instead of the prior art voltage-mode biasing significant area reduction is achieved as well as better isolation between the stages which reduces noise, and improves stability.

11 Claims, 11 Drawing Sheets

POWER AMPLIFIER SYSTEM WITH A CURRENT BIAS SIGNAL PATH

CROSS-REFERENCE TO RELATED APPLICATIONS

This application claims the benefit of U.S. Provisional Patent Application No. 61/419,849 filed Dec. 5, 2010.

BACKGROUND OF THE INVENTION

1. Field of the Invention

The invention relates to the design of integrated circuit (IC) power amplifier systems and more particularly the biasing of the signal path of IC power amplifier systems.

2. Prior Art

Design of amplifiers for various frequency ranges (low, mid, high and radio frequency) using various semiconductor processing technologies (bipolar, CMOS, GaAs, etc.) and in different configurations (single-ended, differential, quadrature, common source, common emitter, common gate, common base, etc.) is well documented in the art. In the art there are described three ways of biasing an amplifier stage: voltage bias, current bias and a hybrid technique using both voltages and currents.

Biasing of low and moderate power amplifiers is relatively straightforward and can be done in a variety of ways. Biasing of high-power, e.g., around or over one watt, amplifiers (PAs) in general, and high-frequency, e.g., around or over one giga Hertz, PAs in particular, is a more complex and challenging problem. This is particularly true with respect to high efficiency performance when little power should be lost on the biasing circuit.

Figure 1:
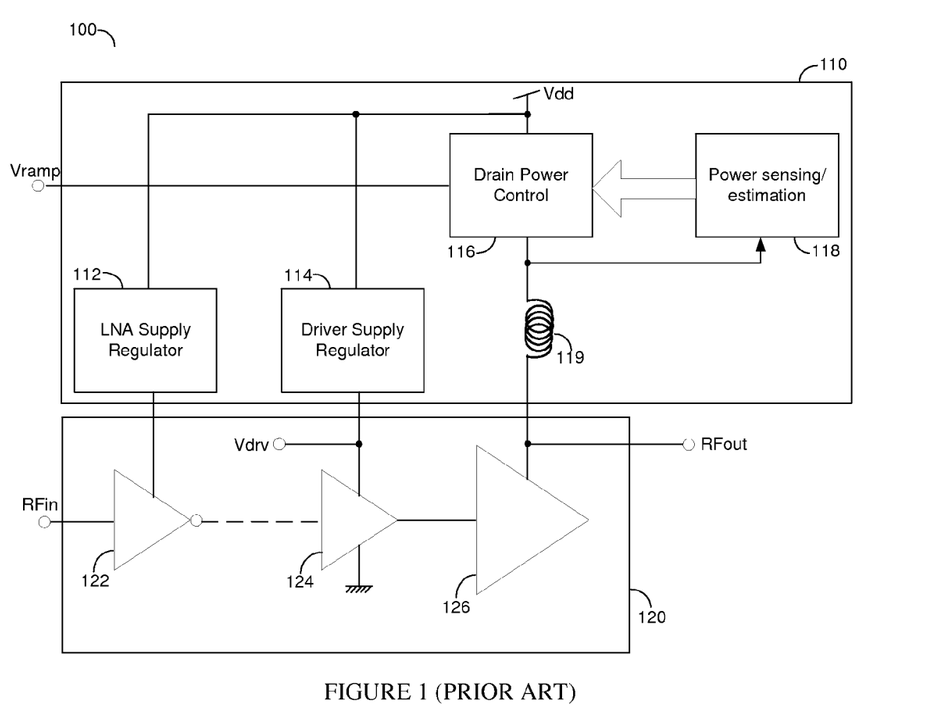
FIG. 1 is a schematic diagram of a voltage-mode PA signal path stages biasing and drain power control technique (prior art).

Today the cellular handset PA market is still dominated by GaAs solutions for the radio frequency (RF) signal path that allow single devices, un-cascoded amplifier stages to be used while handling the large voltage swing of the high-power PA. FIG. 1 shows a typical system level schematic diagram 100 of a cellular PA system using RF integrated circuit (IC) 120, e.g., using GaAs. This integrates the RF signal path driving stages 122 through 124 (it should be noted that while two stages are shown a plurality of such stages may be used) and the output stage 126. The IC 120 may further include a bias circuit for the signal path stages of IC 120. A control IC 110 integrates in a separate device the PA power control that is typically comprised of a power sensing and estimation unit 118 and a drain power control 116 that provides the PA output, typically via a coil 119, the necessary bias for the output stages of IC 120. The IC 110 may further contain the supply voltage for earlier stages of the signal path IC 120.

The two chip solution mandates a simple interface between the RF signal path IC 120 and the power control IC 110. This restricts the PA power control scheme to a single control port. The fact that shipping RF signal between IC 110 and IC 120 is hard to do in the context of high-efficiency, thereby restricting the IC 110 to the drain (collector) PA power control scheme which uses baseband sensing. Using high impedance lines between IC 110 and IC 120 is not a good choice due to its high sensitivity to parasitic coupling.

Therefore, in view of the deficiencies of the prior art solutions it would be valuable to provide a solution that overcomes these deficiencies. Preferably the solution would allow the integration of the power control into a single IC while maintaining the required performance for high frequency operation at the PA stages. It would be further advantageous if the solution can be implemented in CMOS technology.

DETAILED DESCRIPTION OF THE PREFERRED EMBODIMENTS

Power amplifier (PA) systems are typically comprised of a signal path integrated circuit (IC) and a power control IC. Advanced CMOS technologies may allow smart integration of such ICs into a single IC and provide an opportunity to improve performance and cost. Specifically, the radio frequency (RF) signal path is designed to enable local biasing of the gain stages that comprise the RF signal path. By using current-mode biasing instead of the prior art voltage-mode biasing significant area reduction is achieved as well as better isolation between the stages which reduces noise, and improves stability.

Figure 2:
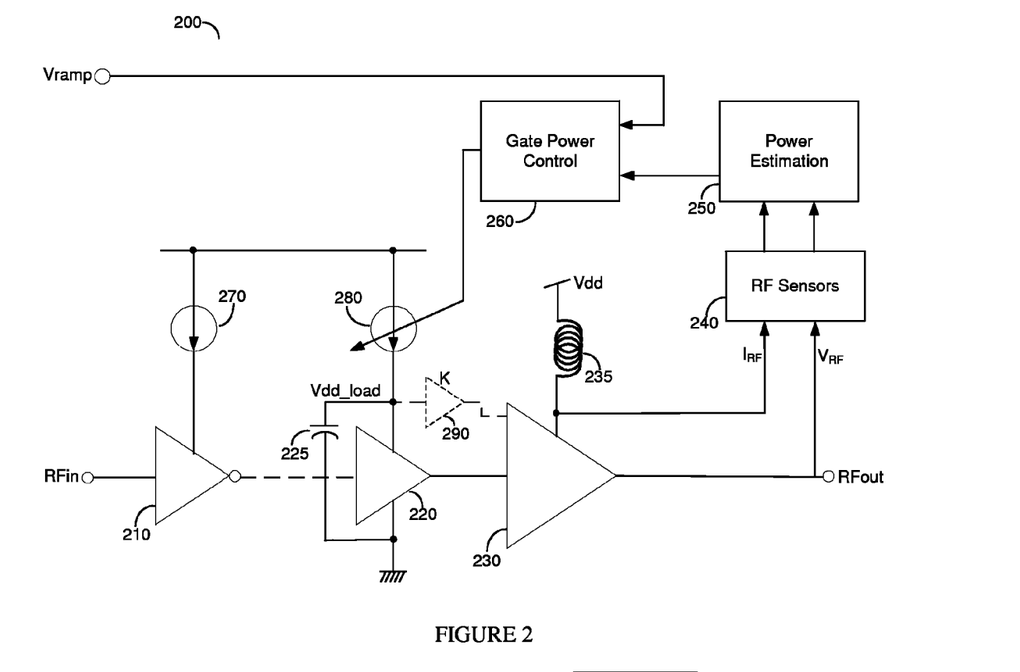
FIG. 2 is a schematic diagram of a gate-power control enabling technique for current-mode biasing of the PA signal path stages.

FIG. 2 is an exemplary and non-limiting schematic diagram 200 of a gate-power control enabling technique for current-mode biasing of the PA signal path stages. One of its advantages is that this circuit may be implemented in complementary metal-oxide semiconductor (CMOS) technology that lends itself for the integration of the RF signal path as well as the power control circuit on a single IC. The driving amplifiers may be amplifiers 210 and 220, however it should be understood that a plurality of amplifiers may be used to move the RFin signal that is input to amplifier 210 all the way to the last amplifier stage 220, prior to the last power amplifier (PA) stage 230.

Since the solution disclosed in FIG. 2 discloses an integrated solution it is now feasible to perform RF output sensing using RF sensors 240 for both current ($I_{RF}$) and voltage ($V_{RF}$). The sensed information may be used after estimation by power estimation unit 250 for the purpose of power control by gate power control unit 260. Furthermore, the single chip PA 200 allows multiple interface signals between the power control blocks and the RF signal path. This enables multi-port power control schemes. This configuration will typically result with better efficiency of the system. Elimination of the large supply regulator and using the gate power control techniques instead, results in a significant die size reduction and therefore also a cost decrease.

The driver 220, being the last driver in the drivers' chain prior to the PA 230, is the second largest power consumer after the PA 230. Therefore, elimination of its supply regulator also results in size and cost reduction. This is ensured by current mode biasing of the driver 220, using a variable current source 280 which is controlled by the gate power control unit 260, based on the output power level. This biasing also ensures a wider bandwidth of the control system since it does not involve yet another local feedback loop as would be the case with the prior art voltage-mode supply regulator. Even if a multi-port power control system is used that needs both currents and voltages, this does not result in a system complexity increase since the driver 220 offers an intrinsic current-to-voltage conversion for the output power level dependent bias current 280. Any additional control voltage that needs to have an output power level dependence, e.g., Vcascode which is the stage K 290, can be easily generated off of the driver 220 local supply voltage Vdd_load. The transfer characteristic of the stage K 290 can be linear, piecewise linear or continuous non-linear.

The significant reduction is area and cost of the solution disclosed with respect of FIG. 2 results from the use of the gate power control in conjunction with current-mode bias of the driver stage. The two largest regulators of the prior art solutions that are now eliminated and hence provide this advantage over the prior art. The front-end PA signal path gain stages (pre-drivers) 210, may also use current-mode biasing 270. This further contributes to area reduction of the integrated solution shown in FIG. 2.

The RF signal path is built with low-voltage devices, e.g., LV-FETs, in order to ensure a fast switching and thus a low-power dissipation during the rising and falling edges of the RF signal. As such, they cannot withstand the full VBAT supply voltage by themselves. For this matter high voltage devices 320, e.g., HV-FETs, are provided for all low voltage RF signal path stages as shown in the exemplary and non-limiting circuit 300 in FIG. 3. The output stage which uses a common source high power transconductance stage uses a high voltage NFET cascode and thus has a low impedance at the drain of the LV-FET. This ensures that the voltage of the drain of the output stage last LV-FET is better controlled and can avoid breakdown. A designer would need to be mindful of the fact that the output stage needs to handle much larger signal swings, e.g., peak voltages of 10 to 15V and peak currents of 2 A or even more. Therefore the RF components on the gates, sources and drains of the power output stage 318 are much larger. The other RF signal path amplifier stages, including the input low-noise amplifier (LNA) 312, any intermediate stage 314, and the last driver 316, use additional FETS in this case the high-voltage FETs of the corresponding current bias sources 322, 324 and 326 respectively, as protection devices.

Figure 3:
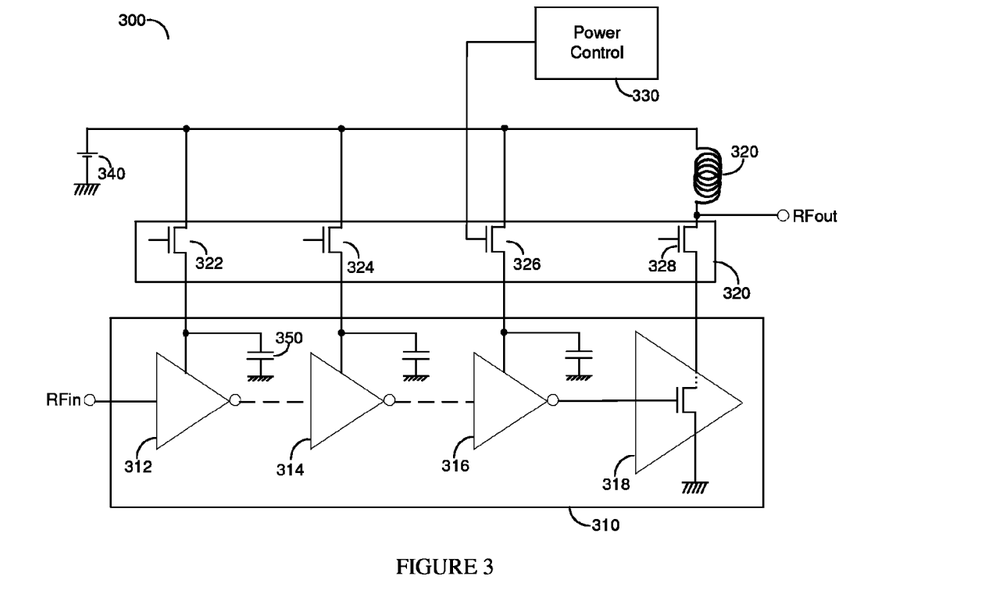
FIG. 3 is a schematic diagram of the bias current sources for the RF signal path and the output high voltage protection device.

The main difference for the LNA 312, pre-driver 314 and the last driver 316 stages is that their corresponding supply lines are high impedance (Z) nodes. Therefore their corresponding voltage level is not well defined. The last driver 316 is controlled by the power control circuit 330, having either a closed feedback loop or an open feed forward path. Therefore, the voltage level of this stage is under the control of the power control loop 330 and it depends strongly on the output power level. A careful design of the power control loop is needed in order to ensure that the loop does not drive the local supply voltage of the last driver 316 above the breakdown voltage limit. Supplementary limiting or clamping stages may be used to achieve this goal.

For the driver stages that are not under the control of the power control 330 loop, i.e., LNA 312 and pre-driver 314, their local supply voltage at the high impedance node of the bias current source is given by the following elements: the stage bypass capacitor 350 value; the operating frequency ($f_{RF}$), and the signal swing and load at the stage output. The voltage at the high impedance nodes has a DC component on which a RF (ripple) signal is overlapped. The larger the size of the stage bypass capacitor 350, and the lower its series resistance and impedance, the lower this ripple is, and the better the control of the peak voltage level. Capacitors 350 are to be placed at close proximity to each of the RF signal path stages.

In the general case the RF signal path may be realized both with LV or HV devices or a combination thereof. Also, the bias current sources can be implemented with both LV and HV devices. The device type choices depend on the specific application and the required power levels in the RF signal path and should not be viewed as a departure from the disclosed invention. However, the most common selection, and without limitation on the scope of the invention, would be to use LV devices for the RF signal path and HV devices for the current bias sources.

Figure 4:
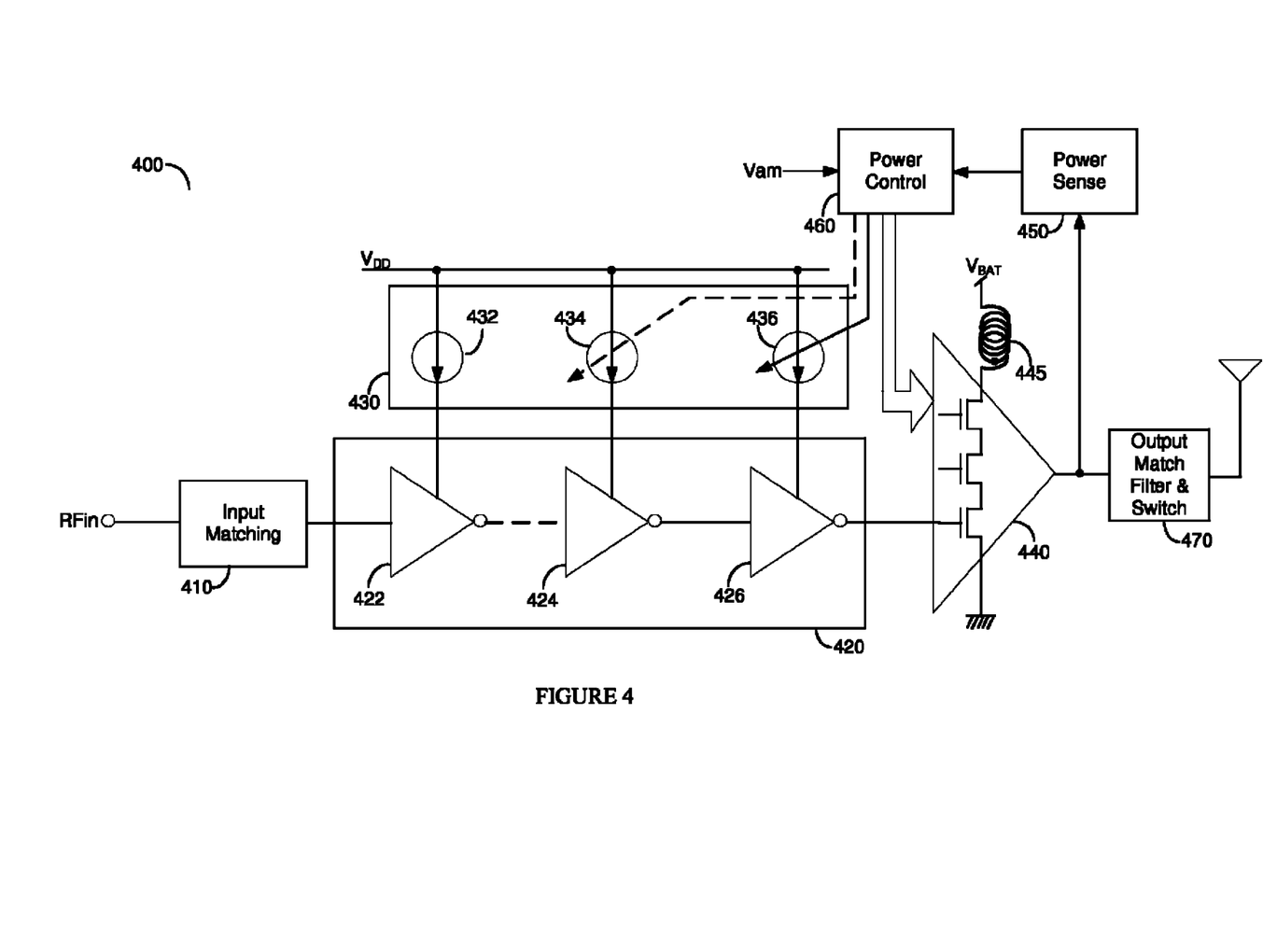
FIG. 4 is a schematic diagram of a current biasing technique for low area RF power amplifiers.

Reference is now made to FIG. 4 that depicts a schematic diagram 400 of a current biasing technique for low area RF power amplifiers in accordance with the principles of the invention. Accordingly a RF signal path 420 comprises a plurality of cascaded drivers, e.g., drivers 422, 424 and 426, as well as a power output stage 440. It further includes a power control circuitry with a power sense 450 to sense the RF output power of the PA 440, as well as a power control unit 460 that is controlled by Vam=Vramp signal provided by the transmitter. The power control unit 460 modulates the bias current of one or several of the back-end drivers, e.g., drivers 424 and 426, and the bias voltage for the cascode devices of the PA 440. The front-end stages, e.g., driver 422, use an r independent bias current, since they drive loads that have a low dependence on the output power level. Using bias current sources instead of bias voltage regulators results in a significant complexity reduction, lower bias noise, need for large compensation capacitors, and lower power dissipation. Furthermore, it is relatively easy to achieve non-constant bias currents that have prescribed variations aimed at compensating certain performance variations of the RF signal path stages.

Figure 5A:
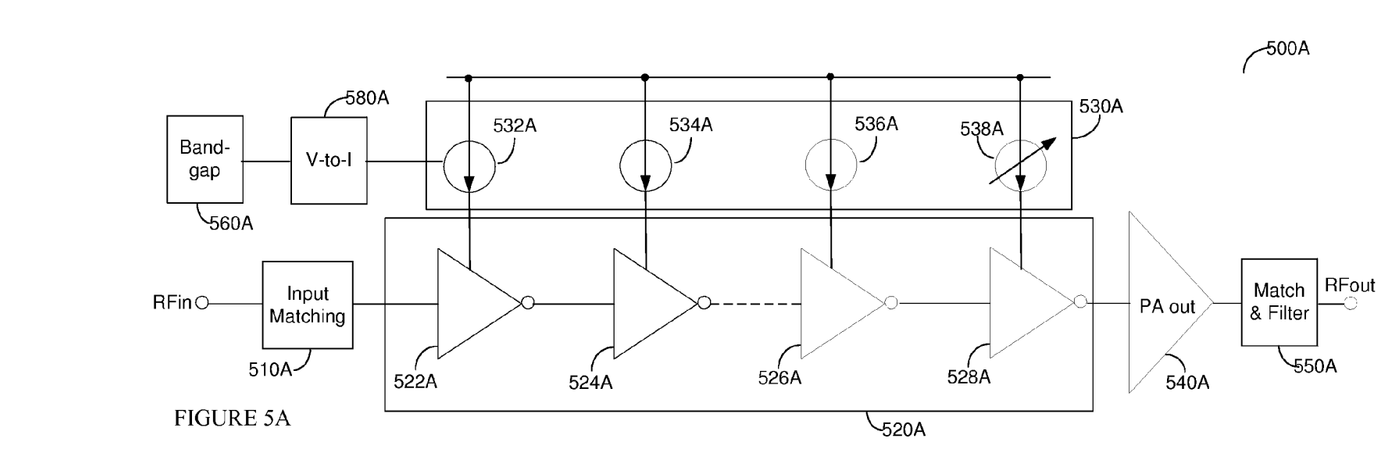
FIG. 5A is a schematic diagram of a biasing technique for a large number of driver stages in accordance with the principles of the invention.

In general, front-end stages are designed for low noise and high gain performance, while output stages are designed for high output power and high efficiency performance. Therefore front-end and back-end stages of the PA signal path have different bias requirements. Reference is now made to FIG. 5A depicting an exemplary and non-limiting schematic diagram 500A of a biasing technique for a large number of driver stages 520A in accordance with principles of the invention. The simplest way to create a bias current that is relatively well-controlled over design corners is to use a band-gap reference voltage 560A that produces a reference voltage with very low process temperature and supply voltage variations. The output of the band-gap voltage reference 560A is fed to a voltage-to-current (V-to-I) converter 580A to generate a constant reference current. In many cases converter 580A uses an external high precision resistor or, alternatively, a calibrated on-chip resistor, to generate the reference current: Iref=Vref/Rref. A set of current minors are usually used to generate all necessary bias currents. The use of a distributed current biasing technique eliminates the parasitic output-to-input coupling though the bias stages.

Figure 5B:
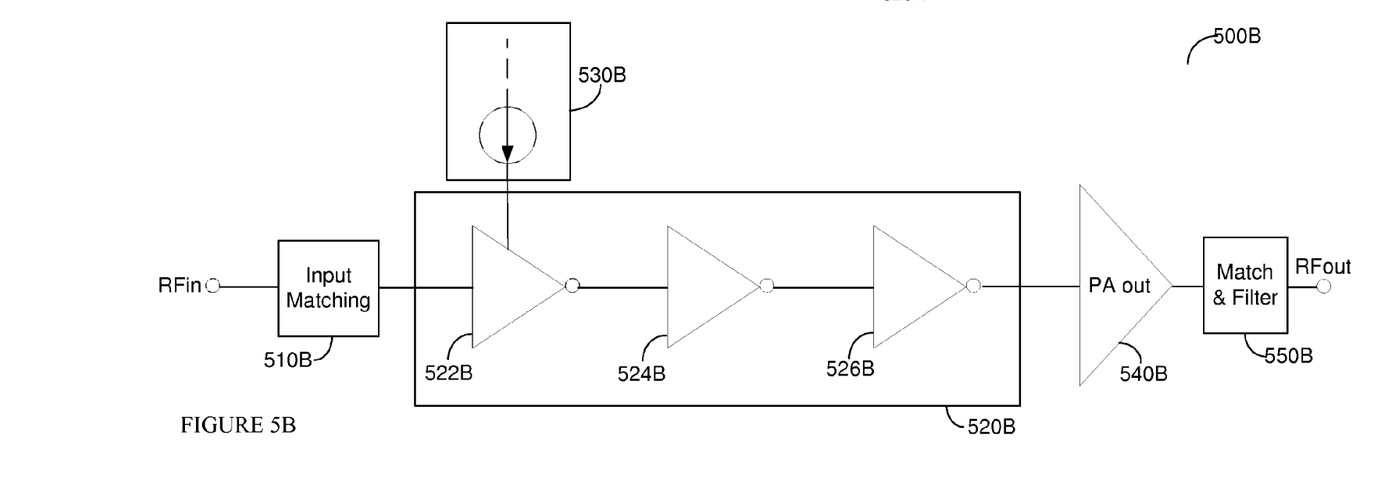
FIG. 5B is a schematic diagram of a biasing technique for a small number of driver stages in accordance with the principles of the invention.

Although simple, using constant bias currents for the PA RF signal path is not the optimum choice. A better choice for the bias current of the PA front-end stages is to use a constant gain bias current as shown in the exemplary and non-limiting FIG. 5B. This ensures that the front-end stage gain does not vary significantly over the design corners and therefore it ensures a low noise contribution for the following stages.

The following discussion pertains to bias techniques to optimize input matching network performance. CMOS PAs usually use a CMOS inverter as their first amplifier stage. It can have various biasing techniques, including: a shunt resistance (Rsh); and, a replica inverter bias (INVrep). In the first case Rsh contributes to the PA real input impedance component, i.e., its resistance, while in the second case the Rbias resistance has a large value and leaves predominantly capacitive input loading impedance. The ground inductance 650 of a common source amplifier is reflected as a real part in the PA input impedance, as shown in the exemplary and non-limiting schematic diagram 600 of FIG. 6.

Figure 6:
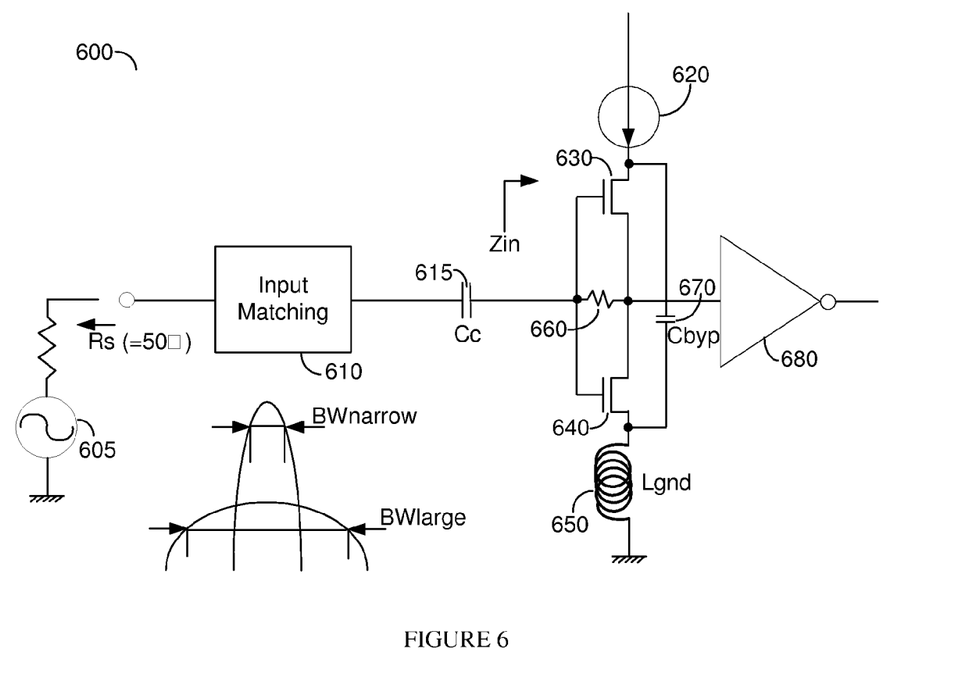
FIG. 6 shows the CMOS device input impedance and input matching network bandwidth versus voltage gain tradeoff.

In most cases the PA input impedance has a relatively small real, i.e., resistive, component and a large capacitive reactance. The input matching network 610 has the role of tuning out the capacitive component and boosting the resistive component to the input standard source impedance, e.g., 50Ω. A small real component of the PA input impedance mandates a large impedance transformation and thus a high quality factor value that results in a narrow band characteristic for the input matching network. Such a narrow bandwidth is detrimental for the multi-band multi-mode PAs. Widening the bandwidth by adding physical resistance in the input matching network will reduce the voltage gain achieved in the front-end and potentially degrade noise performance.

Figure 7A:
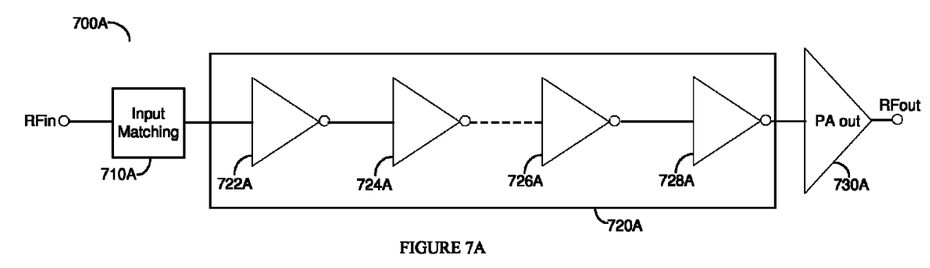
FIG. 7A is a schematic diagram for achieving higher gain in the signal path by using a large number of signal path stages with larger power dissipation.
Figure 7B:
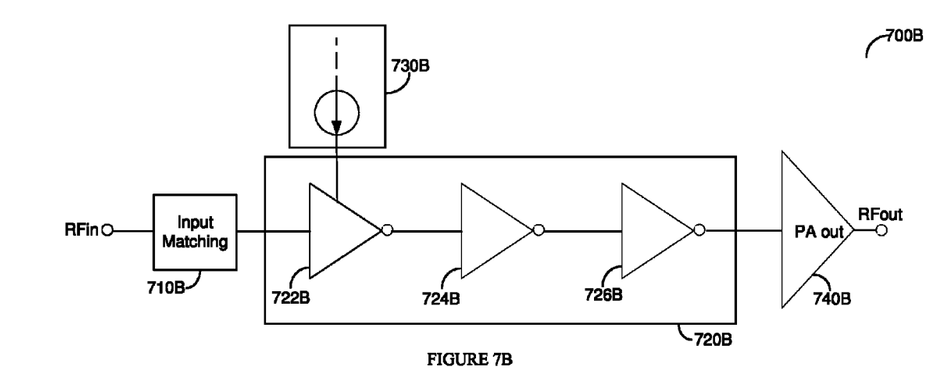
FIG. 7B is a schematic diagram for achieving higher gain in the signal path by using voltage gain in the input matching network for better efficiency.

The following discussion relates to FIG. 7A that depicts and exemplary and non-limiting schematic diagram 700A for achieving higher gain in the signal path by using a large number of signal path stages 720A with larger power dissipation prior to power amplifier 730A, and to FIG. 7B that depicts and exemplary and non-limiting schematic diagram 700B for achieving higher gain in the signal path by using voltage gain in the input matching network for better efficiency. The input matching networks 710A and 710B are passive and thus cannot provide power gain, but stepping down of the impedance from the input generator to the input of the first stage, either 722A or 722B, allows the realization of the voltage gain in the respective input matching network 710A or 710B. This gain is achieved without an active device and therefore is virtually noiseless and virtually with zero power dissipation.

It is desired that the voltage gain in the input matching network is maximized in order to improve noise performance. The degeneration ground inductor 650 is often the dominant contributor to the input real resistive component as shown by:

$$R_{in} \approx g_m * L_{gnd}/C_{gs} \approx \omega_\tau * L_{gnd}$$

Where $L_{gnd}$ is the inductor 650 and $C_{gs}$ is the capacitance of the gate to source of transistor 640. Therefore, maximizing $R_{in}$ value requires a maximization of the first stage device transition frequency $\omega_\tau$. Therefore a constant $f_\tau$ ($\omega_\tau$) bias current generator, 730B for the first stage of the PA signal path results in a low process, temperature and supply variation at the PA input real component. This will minimize the required impedance transformation ratio in the input matching network 710B and therefore result in a wider bandwidth and a higher voltage gain on the input matching network. This helps reducing the number of stages in the PA signal path 720B, with beneficial stability, power and area effects.

Figure 8:
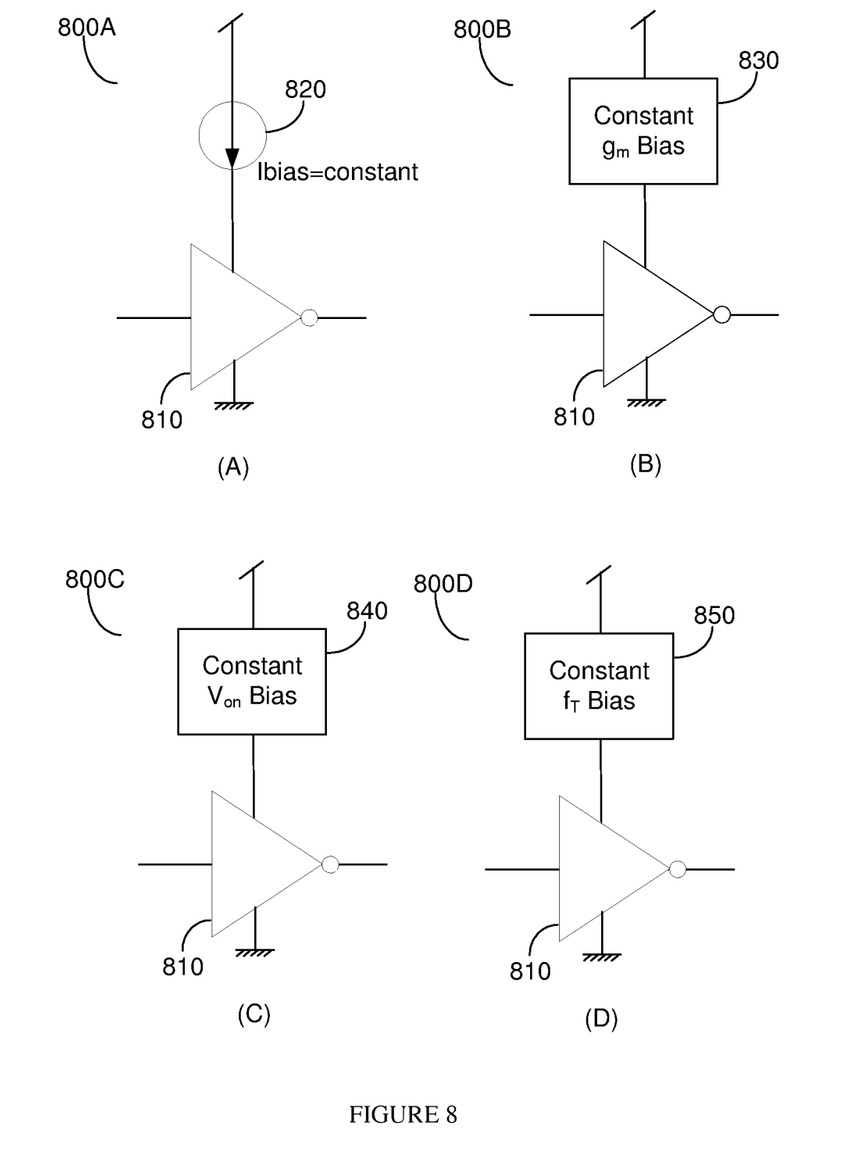
FIG. 8 is a schematic diagram of four circuits for current biasing the CMOS drivers of the signal path.

Reference is now made to FIG. 8 that depicts exemplary and non-limiting circuits 800A, 800B, 800C and 800D for current biasing the CMOS drivers of the signal path. The circuit 800A, having a constant bias source 820, has been shown not to be the optimal solution for the PA front-end stages. From the input matching network perspective the preferred choice is of circuit 810D where the stage bias is a constant $f_\tau$ generator 850. Such a circuit that senses both the device transconductance ($g_m$) and its input capacitance ($C_{gs}$) is not that easy to realize. Therefore alternative simple bias current generators can bring performance close to the ideal constant $f_\tau$ bias scheme.

For the cases where the load resistance of the RF stage is virtually constant, e.g., inductive loads, the circuit 800B, having a constant $g_m$ bias 830, ensures a constant gain in the first active stage and thus a lower noise. This is not necessarily the optimal condition for the input matching network. However, it should be noted that what counts is the combined gain of the input matching network and the first active gain stage. A constant $g_m$ bias results in a reduction of the input real part of the impedance given by:

$$Re(Zin) \approx 1/C_{gs} = t_{ox}/(W*L)$$

wherein $t_{ox}$ has the largest process variation, W is the transistor width and L the transistor length. Circuit 800C shows biasing using a constant Von bias 840, and may be more appropriate from the input matching network perspective since it ensures a closer to constant $f_\tau$ bias condition.

Figure 9:
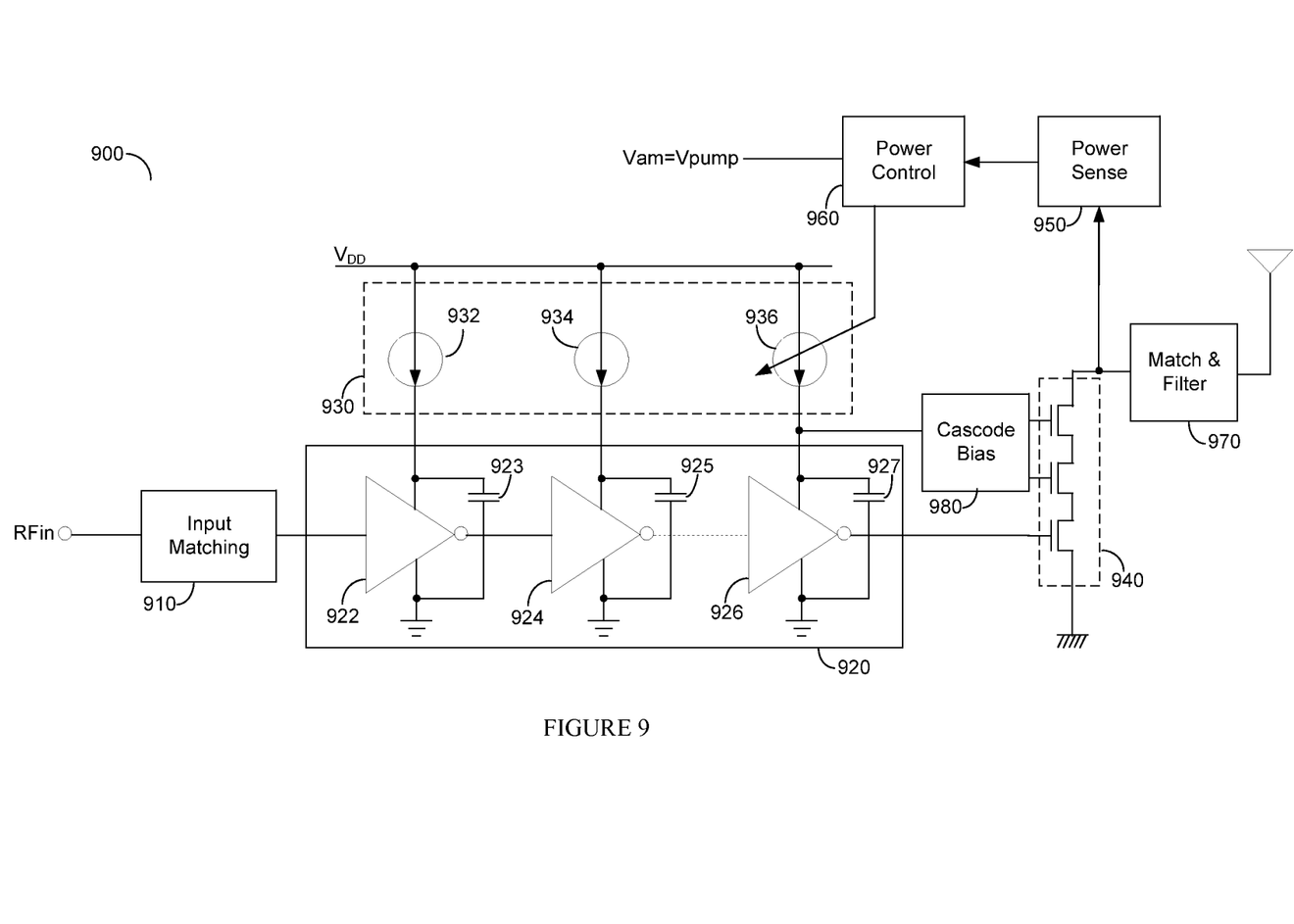
FIG. 9 is a schematic diagram of a circuit having a power control for a RF signal path using a variety of current bias techniques.

FIG. 9 shows an exemplary and non-limiting schematic diagram 900 of a circuit having a power control 960 for a RF signal path 920 using a variety of current bias techniques 930 and a power amplification stage 940. In contrast to voltage-mode biasing that suffer from various instabilities, this is not the case in the current-mode biasing shown in FIG. 9, allowing for the bypass filtering capacitors (Cbyp) 923, 925 and 927 to be large. This ensures a local closure of most RF current generated by the amplifier stage. This reduces the amount of signal noise and ensures a better stability of the PA signal path 920 due to the lower inter-stage coupling. In this respect the most dangerous coupling is between the last stages and the front-end ones. To achieve this circuit 900 comprises various current biasing techniques. The current bias 932 is a constant $f_\tau$ bias or a constant gain bias. The current bias 934 is a constant gain bias. The current bias 936 is a variable current source that is controlled by the power control unit 960 based on the sensing of the RF output as sensed by the power sense unit 950.

Figure 10A:
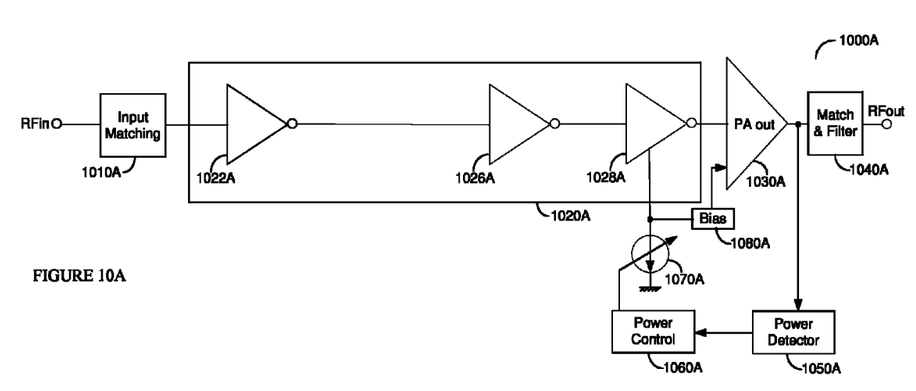
FIG. 10A is a schematic diagram of bias current modulation for optimized performance of a PA using a single current loop.

Optimizing the PA performance usually results in the reduction of the number of stages in the signal path. If only two or three driver stages are used in front of the large power stage, then using a single stage, typically the last stage of the signal path, with output power dependent bias current is a sensible choice. Such an implementation is shown in FIG. 10A that depicts an exemplary and non-limiting schematic diagram 1000A of bias current modulation for optimized performance of a PA using a single current loop. In this case a simple single variable power control loop is implemented. There are three driver stages 1022A, 1026A and 1028A, where the last stage 1028A in the signal path. A low number of signal path stages is helped by the modern deep sub-micron and nanometer CMOS processes that allow a large gain per stage even at RF frequencies.

Figure 10B:
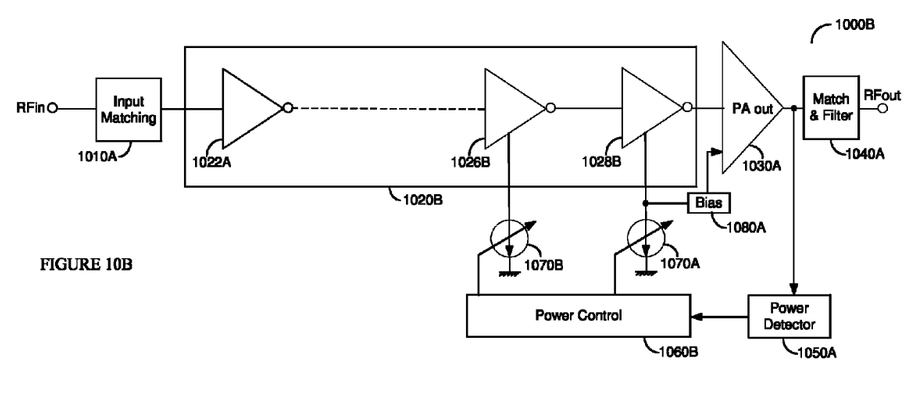
FIG. 10B is a schematic diagram of bias current modulation for optimized performance of a PA using multiple currents loop.

It should be noted that in CMOS processes having lower device maximum operating frequency (f) the gain achievable per stage is lower and more stages are needed in the PA signal path. The exemplary and non-limiting FIG. 10B depicts a schematic diagram 1000B of bias current modulation for optimized performance of a PA using multiple current loops suitable for a large number of drivers in the signal path. Between the first stage 1022A and the one before last stage 1026B there may be one or more additional driver stages as may be necessary to achieve the desired overall gain of the signal path 1020B. In such a case more then on stage, e.g., the last two driver stages 1026B and 1028B, are biased by a variable current bias source, e.g., variable current sources 1070B and 1070A respectively. This can be achieved with a single loop with a constant scaling factor between the two bias currents or using a predefined f(x) dependence function between the two bias currents. It should be noted that while two controlled bias current sources are shown here this should not be viewed as limiting the scope of the invention and multiple such current sources may be used without departing from the scope of the invention. It should be further noted that the use of multiple power control loop is dangerous from the stability and dynamic performance perspective and therefore special care should be taken when designing these for such control.

Figure 11A:
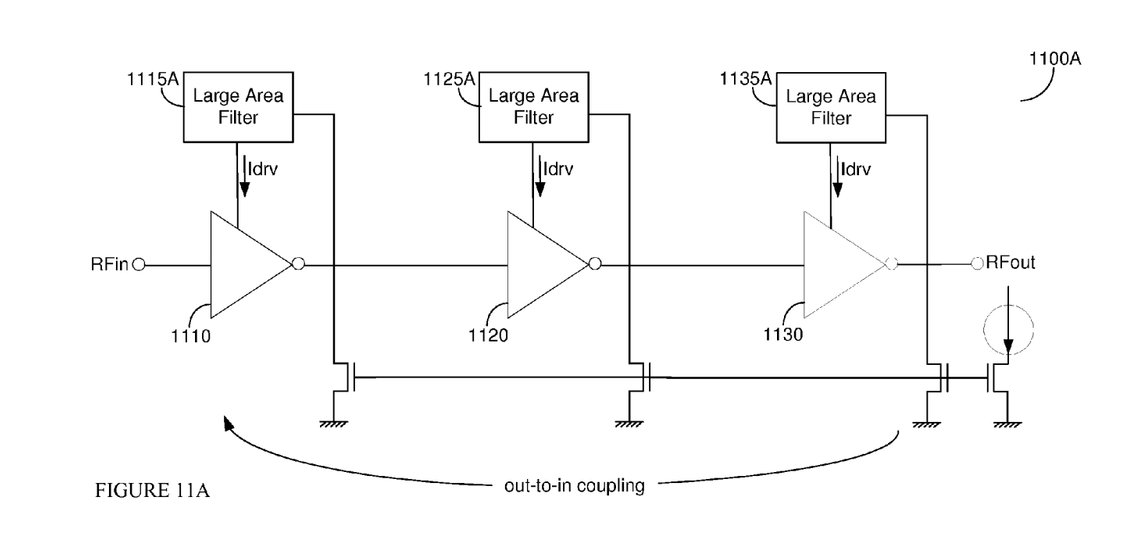
FIG. 11A is a schematic diagram of a shared bias current generators for a high-gain high-power PA signal path (prior art).
Figure 11B:
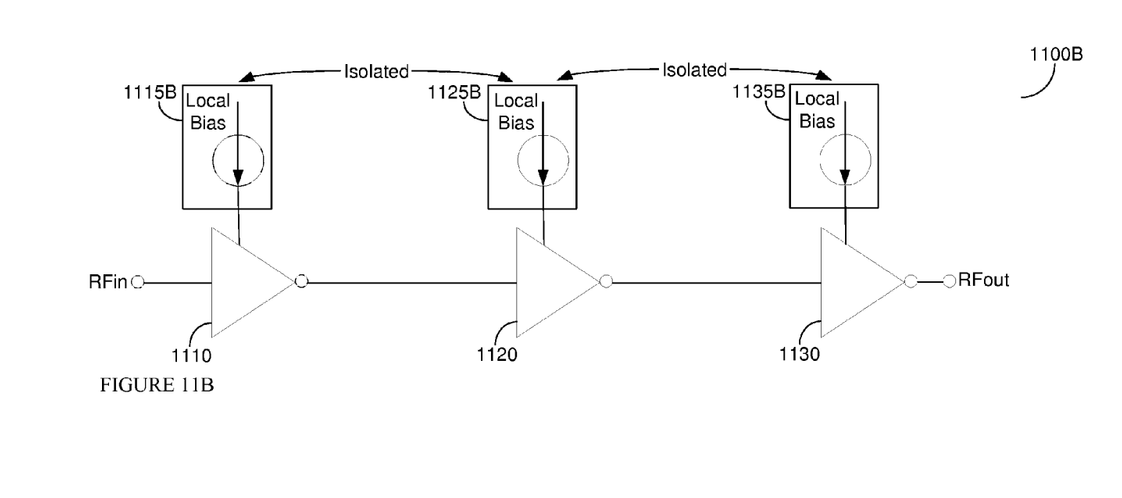
FIG. 11B is a schematic diagram of a distributed bias current generators for a high-gain high-power PA signal path in accordance with the principles of the invention.

Using current-mode bias of the PA signal path stages offers advantages also for the bias noise filtering. FIG. 11A presents a shared biasing technique. This implementation requires the use of several noise filters, e.g., filters 1115A, 1125A and 1135A. In the case of voltage bias the number of filters can even be larger for: the input reference voltage, the regulator amplifier, the output leg current noise, and the feedback path. The need to use all these filters results in a large die area since they need to have relatively low corner frequencies. FIG. 11B depicts a schematic diagram of a circuit 1100B comprising distributed bias current generators 1115B, 1125B and 1135B, for a high-gain high-power PA signal path comprising drivers 1110, 1120 and 1130, and in accordance with the principles of the invention. This preferred embodiment offers a much easier bias noise filtering. Firstly, the input circuitry noise filtering can be realized with an RC filter placed at the gate of the current mirror. Since there is virtually no current at this line, other than leakage, its size can be rather small. Secondly, in some cases, e.g., the low current front-end stage, even the noise of the bias current output lag can be filtered with a RC circuit. This can significantly reduce the bias noise contribution to the overall PA signal path noise. However, it should be understood that in certain embodiments a mixed mode may be used where both current-mode and voltage-mode biasing are used, resulting in improved overall isolation.

The multi-band multi-mode PAs may have different and even sometimes contradicting requirements for the biasing of the different signal path stages. Important factors are the noise specifications, maximum power level, linearity requirements and more.

Figure 12:
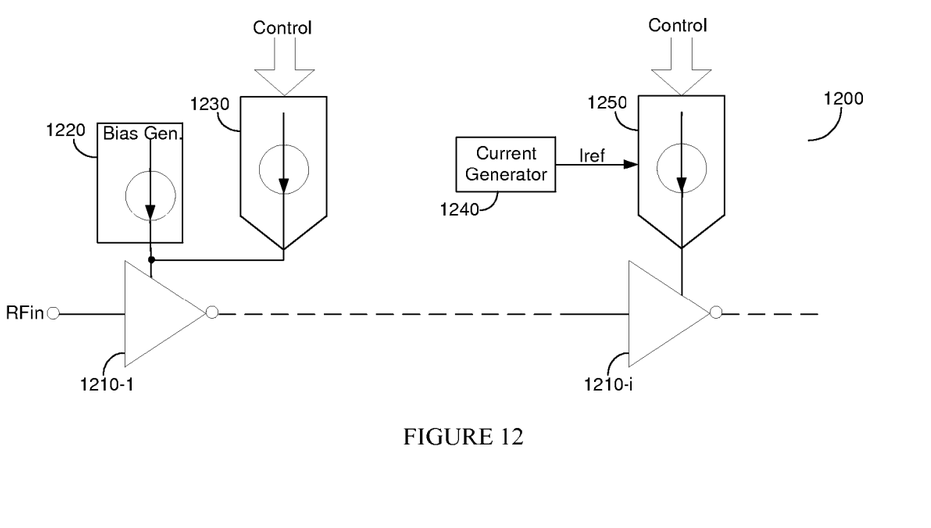
FIG. 12 is a schematic diagram of a generic multi-band multi-mode PA using adjustable/tunable current-mode bias RF signal path.

Using a current mode bias technique according to the principles disclosed herein for the PA RF signal path stages offers a very easy path to achieve an adaptive/tunable/calibrated bias scheme. Reference is made to FIG. 12 that shows a schematic diagram 1200 of a generic multi-band multi-mode PA using adjustable/tunable current-mode bias RF signal path. The signal path comprises multiple gain stages 1210 of which 1201-1 and 1210-i are shown. The two stages shown have two types of current-mode biasing. The gain stage 1210-1 has a bias generator 1220 with an offset bias current component 1230 which can be easily implemented using either digital means such as a current digital-to-analog convertor (DAC) or analog means, such as an adjustable current source. The gain stage 120-i has a multiplying DAC current bias that has a bias reference current generator 1240 the output of which is multiplied by a digital factor to generate the bias current 1250. This architecture lends itself to be optimized for a desired RF signal path operating in several bands or different power level modes.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. A power amplifier (PA) system comprising:
    a radio frequency (RF) signal path comprising a plurality of gain stages;
    an output stage the input of which is coupled to the output of the last gain stage of the RF signal path;
    one or more current-mode bias sources, each of the one or more current-mode bias sources comprising a transistor with a drain contact coupled to a DC power supply and a source contact coupled to a different one of the plurality of gain stages, each of the one or more current-mode bias sources adapted to supply a biasing current to a respective gain stage of the RF signal path; and
    a power control unit adapted to control the biasing current of a first one of the one or more current-mode bias sources responsive to sensing an output signal of the output stage.

2. The PA system of claim 1, wherein the first current-mode bias source is adapted to bias the last gain stage of the RF signal path.

3. The PA system of claim 1, wherein each of the one or more current-mode bias sources is isolated from other current-mode bias sources of the PA system.

4. The PA system of claim 1, wherein each of the one or more current-mode bias sources is one of: a constant $g_m$ bias current source, a constant gain bias current source, a constant $f_t$ bias current source.

5. The PA system of claim 1, wherein the PA system is implemented as a single integrated circuit (IC) in a CMOS process technology.

6. A method of operating a power amplifier (PA) system comprising:
    providing an RF signal path having a plurality of gain stages connected in series, each gain stage having a signal input and a signal output;

providing a power output stage having an input signal and an output signal, wherein the input signal of the power output stage is coupled to the output signal of the last gain stage of the plurality of gain stages;

selecting a current-mode bias source comprising a transistor with a drain contact coupled to a DC power supply and a source contact coupled to a different one of the plurality of gain stages and adapted to supply a biasing current to a first gain stage of the RF signal path of the PA system for optimization of the first gain stage for at least one of: gain, noise performance; and controlling the biasing current of the current-mode bias source responsive to sensing an output signal of an output stage of the PA system.

7. The method of claim 6, further comprising:
selecting an input resistance of the first gain stage of the RF signal path to control noise contribution of following stages of the RF signal path.

8. The method of claim 6, further comprising:
adjusting of the current-mode bias source by one of: a current digital-to-analog (DAC) controlled adjustment, continuous current variation.

9. The method of claim 6, further comprising:
providing at least a current-mode bias source to at least one other of the plurality of gain stages of the RF signal path.

10. The PA system of claim 1 wherein the power control unit is coupled to the one or more current-mode bias sources via a gate contact.

11. The PA system of claim 10 wherein the power control unit is configured to control the biasing current of the one or more current-mode bias sources by altering a voltage presented to the gate contact of the one or more current-mode bias sources.

* * * * *